(12) United States Patent
Parish et al.

(10) Patent No.: US 10,577,130 B1
(45) Date of Patent: Mar. 3, 2020

(54) FLEXIBLE RADIO FREQUENCY CONVERTERS FOR DIGITAL PAYLOADS

(71) Applicant: Space Systems/Loral, LLC, Palo Alto, CA (US)

(72) Inventors: Robert Mark Parish, San Jose, CA (US); Rick-Nghia Nguyen, Menlo Park, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 336 days.

(21) Appl. No.: 15/372,276

(22) Filed: Dec. 7, 2016

(51) Int. Cl.
| | |
|---|---|
| *H02M 3/02* | (2006.01) |
| *B64G 1/10* | (2006.01) |
| *H05K 7/14* | (2006.01) |
| *H05K 1/18* | (2006.01) |
| *B64G 1/64* | (2006.01) |

(52) U.S. Cl.
CPC ............ *B64G 1/1007* (2013.01); *B64G 1/64* (2013.01); *H02M 3/02* (2013.01); *H05K 1/181* (2013.01); *H05K 7/1427* (2013.01); *H05K 2201/10636* (2013.01)

(58) Field of Classification Search
CPC ........ B64G 1/1007; B64G 1/64; H02M 3/02; H05K 7/1427; H05K 1/181; H05K 2201/10636
See application file for complete search history.

(56) References Cited

U.S. PATENT DOCUMENTS

| | | | | |
|---|---|---|---|---|
| 5,666,646 A * | 9/1997 | McCollum | ............... | H04B 1/74 455/15 |
| 5,983,088 A * | 11/1999 | Aschwanden | ........... | H04N 5/50 348/E5.097 |
| 6,694,129 B2 * | 2/2004 | Peterzell | ................ | H03D 3/008 455/208 |
| 6,697,603 B1 * | 2/2004 | Lovinggood | ...... | H04B 7/15528 370/315 |
| 6,920,185 B2 * | 7/2005 | Hinson | ................ | H04B 1/0003 348/E7.052 |
| 7,050,765 B2 * | 5/2006 | Ammar | .................... | H01Q 1/02 343/772 |
| 7,075,816 B2 * | 7/2006 | Fee | ..................... | H01L 21/4842 257/E23.046 |
| 8,311,156 B2 * | 11/2012 | Seendripu | ................ | H04B 1/28 375/316 |
| 9,136,861 B1 * | 9/2015 | Fleishman | ............ | H03M 1/201 |
| 9,537,684 B2 * | 1/2017 | Stauffer | ............ | H04L 25/03343 |

(Continued)

OTHER PUBLICATIONS

Julien Happich, "Hermetically sealable HTCC air-cavity QFN packages," EE news, Nov. 14, 2013, pp. 1 (Year: 2013).*

(Continued)

*Primary Examiner* — Pinping Sun
(74) *Attorney, Agent, or Firm* — Weaver Austin Villeneuve & Sampson LLP

(57) ABSTRACT

This disclosure provides systems, methods and apparatus for a flexible radio frequency (RF) converter. In one aspect, a subsystem of a spacecraft can include a flexible RF converter having a printed circuit board (PCB), and a synthesizer and controller disposed on the PCB. The PCB can be placed within a chassis. The controller can communicate with the synthesizer to adjust a frequency of a synthesizer signal generated by the synthesizer, which is used to adjust a frequency of an input RF signal.

20 Claims, 4 Drawing Sheets

(56) References Cited

U.S. PATENT DOCUMENTS

| | | | |
|---|---|---|---|
| 2002/0041340 A1* | 4/2002 | Suzuki | H03J 1/0041 348/731 |
| 2003/0016701 A1 | 1/2003 | Hinson | |
| 2005/0053336 A1* | 3/2005 | Ito | G02B 6/4201 385/89 |
| 2005/0199987 A1* | 9/2005 | Danno | H01L 21/561 257/672 |
| 2008/0090516 A1 | 4/2008 | Thomas et al. | |
| 2008/0318522 A1 | 12/2008 | Nilsson | |
| 2010/0019300 A1* | 1/2010 | Yu | H01L 23/5227 257/296 |
| 2010/0167684 A1* | 7/2010 | Kerth | H04B 1/0003 455/339 |
| 2010/0214030 A1* | 8/2010 | McDonald | H03L 1/022 331/34 |
| 2011/0012242 A1* | 1/2011 | Mosher | H01L 23/043 257/676 |
| 2014/0008769 A1* | 1/2014 | Pagaila | H01L 25/0657 257/621 |
| 2014/0139293 A1* | 5/2014 | Tsangaropoulos | H03L 1/022 331/48 |
| 2015/0071248 A1* | 3/2015 | Faerber | H04W 36/0055 370/331 |
| 2015/0139070 A1 | 5/2015 | Saha et al. | |
| 2016/0233869 A1* | 8/2016 | Khoury | H03L 7/099 |
| 2017/0187451 A1* | 6/2017 | Ralph | H04B 7/18515 |
| 2017/0230920 A1* | 8/2017 | Shwartz | H04B 17/345 |
| 2018/0047588 A1* | 2/2018 | Rogren | H01L 21/4821 |
| 2018/0073354 A1* | 3/2018 | Olivio | E21B 47/011 |

OTHER PUBLICATIONS

David P. Woody, et. al., "Controller-area-network bus control and monitor system for a radio astronomy interferonneter," Review of Scientific Instruments, Oct. 2007, pp. 1-10 (Year: 2007).*

ThalesAlenia Space, "Flexible RF/IF Down-Converter for Flexible Payload," ESA Telecommunications, (downloaded from https://artes.esa.int/projects/flexiblerfifdownconverterflexiblepayload), Jun. 9, 2016, 3 pages.

* cited by examiner

FLEXIBLE RADIO FREQUENCY CONVERTERS FOR DIGITAL PAYLOADS

TECHNICAL FIELD

This disclosure relates generally to radio frequency (RF) converters, and more particularly to a flexible RF converter for a digital satellite payload.

BACKGROUND

Spacecraft for communications and broadcast services receive signals at an uplink frequency, down convert the frequency of the received signals to an intermediate frequency (IF), and provide those down converted receive signals to an input of a digital channelizer processor (DCP) for processing. The processed signals (at the down converted IF frequency) are then provided at the output of the DCP for frequency up conversion at a downlink frequency. Thus, downlink frequencies are generally shifted with respect to the uplink frequencies. However, as the spacecraft's payload requirements change (e.g., as a result of changes in the spacecraft's orbit location, service demand due to population changes, etc.), the frequencies shifted among might need to change. Thus, an improved system for frequency converters is desired.

SUMMARY

The systems, methods and devices of this disclosure each have several innovative aspects, no single one of which is solely responsible for the desirable attributes disclosed herein.

One innovative aspect of the subject matter described in this disclosure can be implemented in an apparatus comprising: a spacecraft payload including a digital channelizer processor (DCP) and a flexible radio frequency (RF) converter, the RF converter including: a printed circuit board (PCB); a local oscillator synthesizer disposed on the PCB, the synthesizer configured to provide a synthesizer signal; a control interface disposed on the PCB, the controller communicatively coupled with the DCP and the synthesizer and configured to adjust a frequency of the synthesizer signal provided by the synthesizer; a DC-DC converter; and a chassis; wherein the chassis is configured to enclose the PCB, the synthesizer, the control interface, and the DC-DC converter; the RF converter is configured to receive an input radio frequency (RF) signal within a first frequency band and provide an output RF signal at a second, different frequency band, the second frequency band being adjustable based on the frequency of the synthesizer signal.

In some examples, one or both of the synthesizer and the control interface are packaged in Quad Flat No-leads (QFN) packages. In some examples, the QFN packages are hermetically sealed. In some examples, the QFN packages are surface mounted on the PCB. In some examples, the chassis is not hermetically sealed.

In some examples, the second frequency band is a lower frequency band than the first frequency band.

In some examples, the second frequency band is a higher frequency band than the first frequency band.

In some examples, the controller is further configured to adjust the frequency of the synthesizer signal such that the input RF signal is provided at a third frequency band, the third frequency band different than the second frequency band.

In some examples, the control interface communicates with the synthesizer using a controller area network (CAN) bus interface.

In some examples, the DC-DC power converter disposed on the PCB is configured to provide a voltage source to the control interface and the synthesizer.

Another innovative aspect of the subject matter described in this disclosure can be implemented in a spacecraft payload subsystem comprising: a flexible radio frequency (RF) converter, the RF converter including: a printed circuit board (PCB), a local oscillator synthesizer disposed on the PCB, the synthesizer configured to provide a synthesizer signal, a control interface disposed on the PCB, the control interface communicatively coupled with the synthesizer and configured to adjust a frequency of the synthesizer signal provided by the synthesizer, a DC-DC converter, and a chassis; wherein the chassis is configured to enclose the PCB, the control interface, and the DC-DC converter, wherein the RF converter is configured to receive an input radio frequency (RF) signal within a first frequency band and provide an output RF signal at a second, different frequency band, the second frequency band being adjustable based on the frequency of the synthesizer signal; and a digital channelizer processor (DCP) circuit configured to receive the output RF signal and adjust properties of the output RF signal, the DCP circuit communicatively coupled with the control interface.

Another innovative aspect of the subject matter described in this disclosure can be implemented in a spacecraft payload subsystem comprising: a digital channelizer processor (DCP) circuit configured to provide an input radio frequency (RF) signal; and a flexible radio frequency (RF) converter, the RF converter including: a printed circuit board (PCB), a local oscillator synthesizer disposed on the PCB, the synthesizer configured to provide a synthesizer signal, a control interface disposed on the PCB, the controller communicatively coupled with the DCP circuit and the synthesizer to adjust a frequency of the synthesizer signal provided by the synthesizer, a DC-DC converter, and a chassis configured to enclose the PCB, the synthesizer, the DC-DC converter and the control interface, wherein the RF converter is configured to receive the input RF signal within a first frequency band and provide an output RF signal at a second, different frequency band, the second frequency band being adjustable based on the frequency of the synthesizer signal.

BRIEF DESCRIPTION OF THE DRAWINGS

The included drawings are for illustrative purposes and serve only to provide examples. These drawings in no way limit any changes in form and detail that may be made by one skilled in the art without departing from the spirit and scope of the disclosed embodiments.

Figure 1:
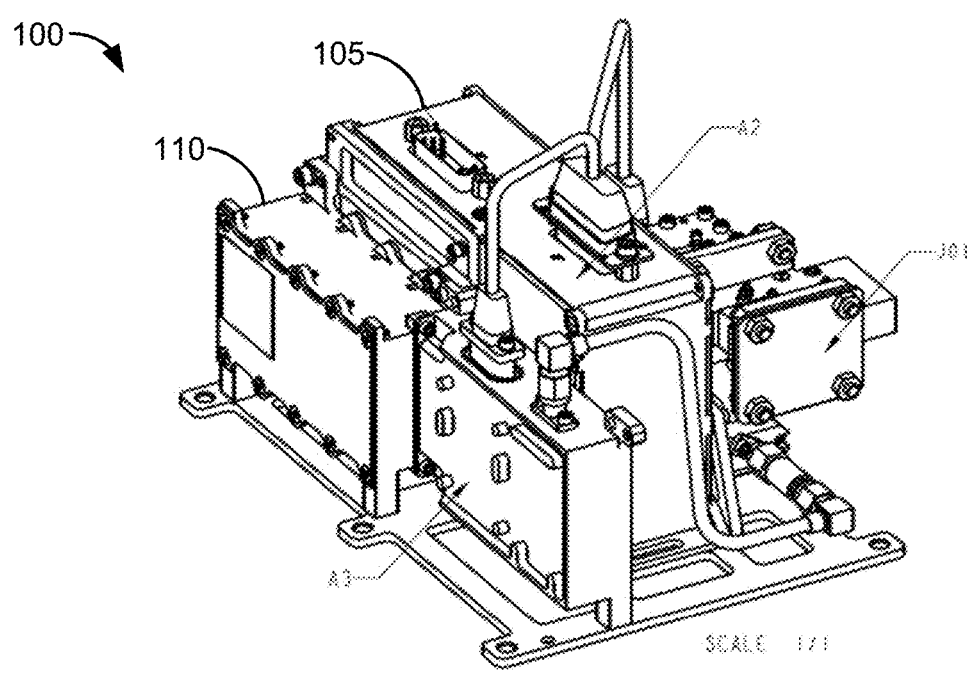
FIG. 1 is an example of a radio frequency (RF) converter.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the disclosed subject matter, as defined by the appended claims.

DETAILED DESCRIPTION

Specific exemplary embodiments will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. It will be understood that although the terms "first" and "second" are used herein to describe various elements, these elements should not be limited by these terms. These terms are used only to distinguish one element from another element. As used herein, the term "and/or" includes any and all combinations of one or more of the associated listed items. The symbol "/" is also used as a shorthand notation for "and/or".

The terms "spacecraft", "satellite" may be used interchangeably herein, and generally refer to any orbiting satellite or spacecraft system.

A satellite communications network can include a satellite at an orbital location providing downlink communication services with a user terminal (e.g., a user device such as a phone, tablet, laptop, transportation vehicles such as airplanes, trains, ships, etc.) via generation of a forward user downlink signal. The user terminals can provide uplink communication with the satellite via generation of a return user uplink signal.

For example, the uplink communications can be received by the satellite within one frequency band, shifted to an intermediate frequency (IF) band for processing within a digital channelizer processor (DCP), and then the processed signals generated by the DCP can be shifted again to a second frequency band for providing downlink communication at that second frequency band. The first and second frequency bands can be different. As a result, downlink frequencies are generally shifted with respect to the uplink frequencies. The shifting from the first frequency band to the IF band can be done by a down converter (i.e., convert a signal from a frequency within the first band to a lower frequency within the IF band). The shifting from the IF band to the second frequency band can be done by an up converter (i.e., convert a signal from an IF band to a higher frequency within the second frequency band). However, in other implementations, the inputs to the DCP can be up converted and the outputs of the DCP can be down converted. The frequency bands can include the C-band, Ku-band, Ka-band, UHF, L-band, or other frequency bands of the electromagnetic spectrum.

The up conversion and down conversion can be performed by radio frequency (RF) converters. FIG. 1 is an example of a radio frequency (RF) converter. In FIG. 1, RF converter 100 can be an RF down converter or an RF up converter including several modules assembled and cabled together. Each of the different modules can be packaged within a separate hermetic assembly (i.e., a sealed housing such that gases cannot enter). For example, module 105 might be a DC-DC converter and module 110 can be a local oscillator (LO). That is, module 105 might include circuitry for a DC-DC converter that is hermetically sealed therein. Likewise, module 110 can include a LO that is also hermetically sealed therein. The other modules of RF converter 100 can similarly include other components or circuitry for other converter functions within RF converter 100.

Accordingly, RF converter 100 in FIG. 1 can provide the conversion of signals among different frequency bands, as previously discussed. However, RF converter 100 in FIG. 1 can be bulky and occupy a significant amount of available space and weight of the payload of a spacecraft. Moreover, assembling RF converter 100 can be difficult. For example, RF converter 100 might be hand-assembled and each module might need to be individually tested prior to assembly RF converter 100

Figure 2:
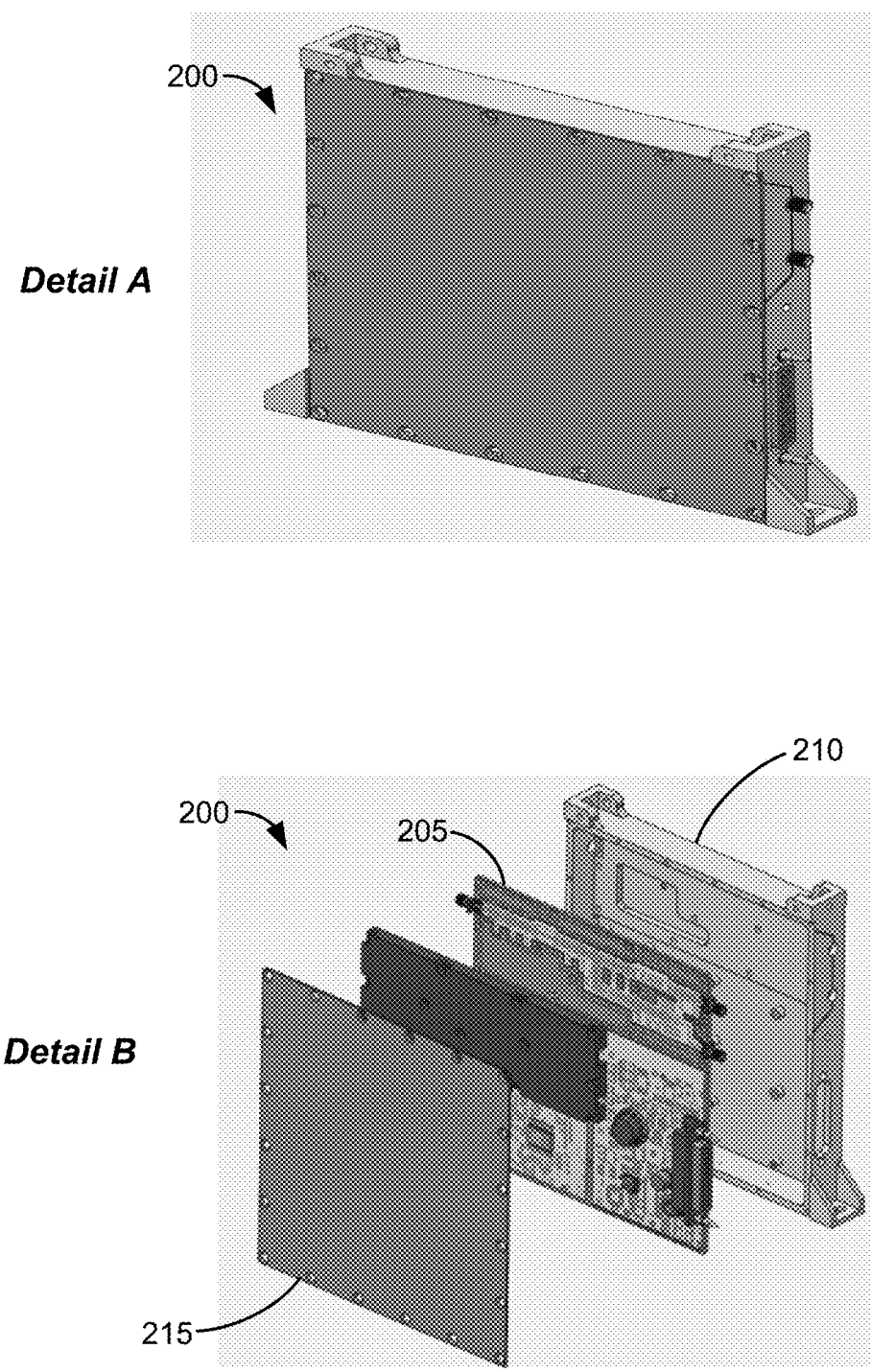
FIG. 2 is an example of a flexible RF converter.

FIG. 2 is an example of a flexible RF converter, according to an implementation. FIG. 2, Detail A, illustrates a flexible RF converter 200 as assembled for flight integration. FIG. 2, Detail B, illustrates an exploded view of the flexible RF converter 200. As illustrated in FIG. 2, the chassis 210 and the chassis cover 215 can house a printed circuit board (PCB) 205. The PCB 205 may include monolithic microwave integrated circuits (MMICs) and digital circuit components to implement the frequency conversion of signals provided to the inputs of a DCP or the frequency conversion of signals provided at the outputs of a DCP. In contrast to the example of RF converter 100 of FIG. 1, an RF converter housed within chassis 200 in FIG. 2 can be less bulky, reducing the space occupied and weight used of the payload of a spacecraft.

Moreover, each of the MMICs and digital circuit components can be packaged within Quad Flat No-leads (QFN) packages, each of which are hermetically sealed. As a result, the entire chassis 200 does not need to be hermetically sealed, reducing assembly costs. Since the MMICs and digital circuit components can be packaged within QFN packages, they can be placed on the PCB using automated machines, for example, via surface mounting. Packaging the devices in QFN packages can be useful, for example, because the packages can provide operation well within the frequency bands needed for an RF converter. This results in a cheaper and faster manufacturing process. Additionally, since chassis 200 can be card-like in shape (e.g., relatively rectangular with one or more flat surfaces), multiple chassis 200 can be stacked together or placed in close proximity to each other, allowing for easier assembly of the spacecraft.

FIG. 2, Detail B, illustrates an exploded view of the flexible RF converter 200. The illustrated flexible RF converter 200 includes a chassis 210 and a chassis cover 215 and a PCB 205 on which MMICs and digital circuit components are integrated. That is, PCB 205 can be housed within chassis 200 and include components to implement an RF converter. In some implementations, PCB 205 can be a multilayer board that can route interconnect coupling the MMICs and digital circuit components.

Figure 3:
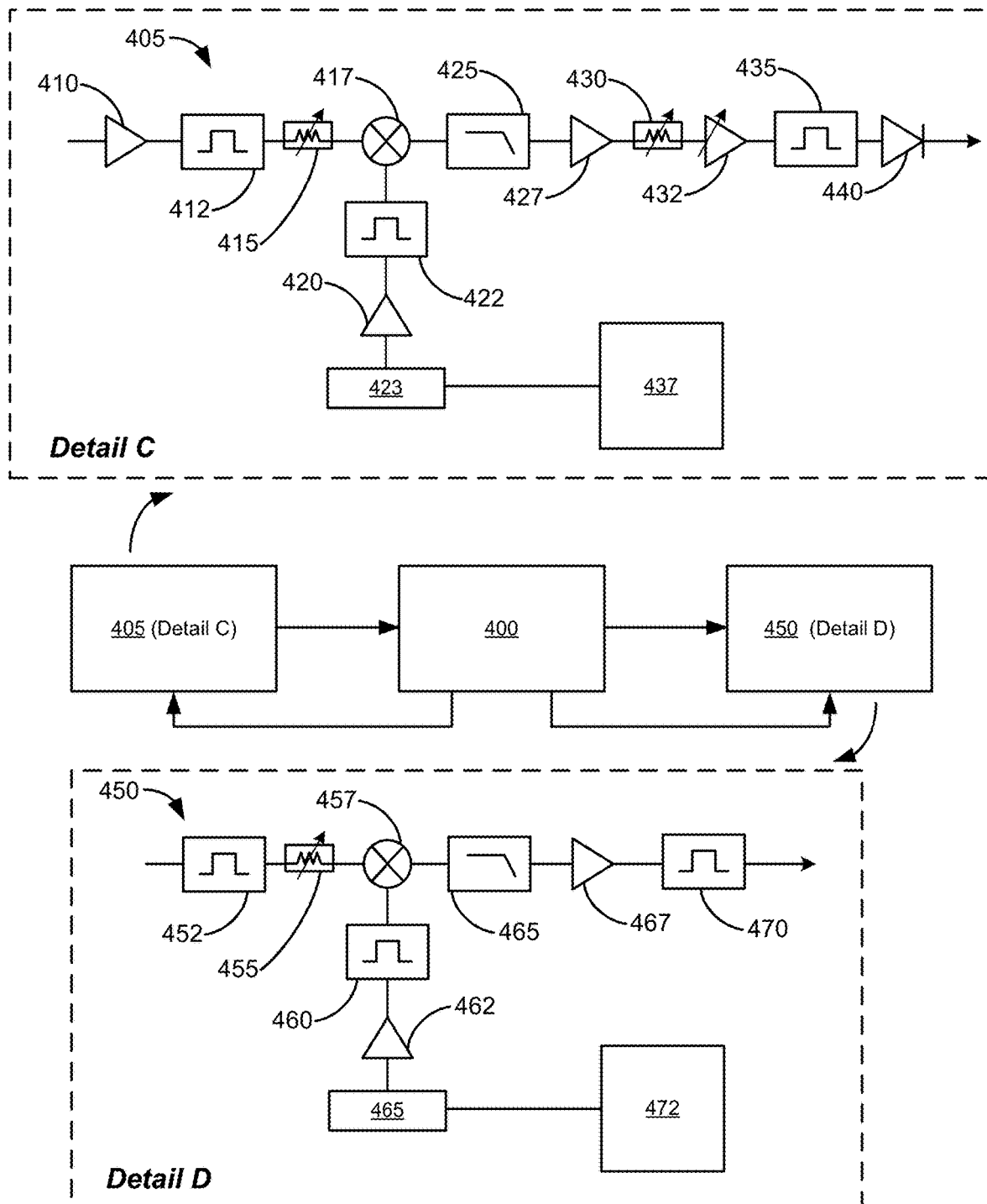
FIG. 3 is an example of a flexible RF converter block diagram.

FIG. 3 is a simplified partial block diagram of an example of a satellite payload subsystem, according to an implementation. In FIG. 3, flexible RF downconverter 405 down converts the frequency of a signal received at its input to an IF frequency and provides that down converted signal to DCP 400. DCP 400 processes the down converted signal and provides it to flexible RF upconverter 450. In the implementation illustrated in FIG. 3, RF upconverter 450 can up convert the received signal from the IF frequency to a higher frequency, as previously discussed. In other implementations, RF downconverter 405 may be replaced with an upconverter that can provide up conversion and RF upconverter 450 may be replaced with a downconverter that can provide down conversion.

Referring to Detail C in FIG. 3, RF downconverter 405, if is implementing an RF down converter, a signal received by an antenna feed of a phased array antenna of the satellite can be provided as an input to the low noise amplifier 410. Low noise amplifier 410 can amplify a relatively low-power signal while introducing little additional noise. Next, image noise filer 412 can remove some unwanted characteristics from the signal (e.g., spurs, unwanted frequencies, etc.). Attenuator 415 can reduce the power of the signal. In some implementations, attenuator 415 can be removed from RF downconverter 405. Mixer 417 can receive the signal (following the processing by low noise amplifier 410, image noise filter 412, and attenuator 415) and generate the signal at a new frequency based on an input provided by synthesizer 423. For example, synthesizer 423 can generate a synthesizer signal that is provided to mixer 417 (e.g., via amplifier 420 and filter 422). Mixer 417 can receive the synthesizer signal and the input signal (i.e., the signal provided to RF downconverter 405) and shift the frequency of the input signal. For example, synthesizer 423 can provide the functionality of a local oscillator providing the synthesizer signal to mixer 417. Mixer 417 can be a frequency mixer that generates a signal at a new frequency based on two other signals. As a result, if mixer 417 receives the input signal and the synthesizer signal, it can generate, or translate or convert, the input signal at a new frequency. That is, it can carry the data of the input signal, but at a new, intermediate frequency (IF). The input signal at the intermediate frequency is then provided to harmonic filter 425, amplified by amplifier 427, attenuated by attenuator 430, amplified by amplifier 432, filtered by anti-aliasing filter 435, and limiter 440.

Figure 4:
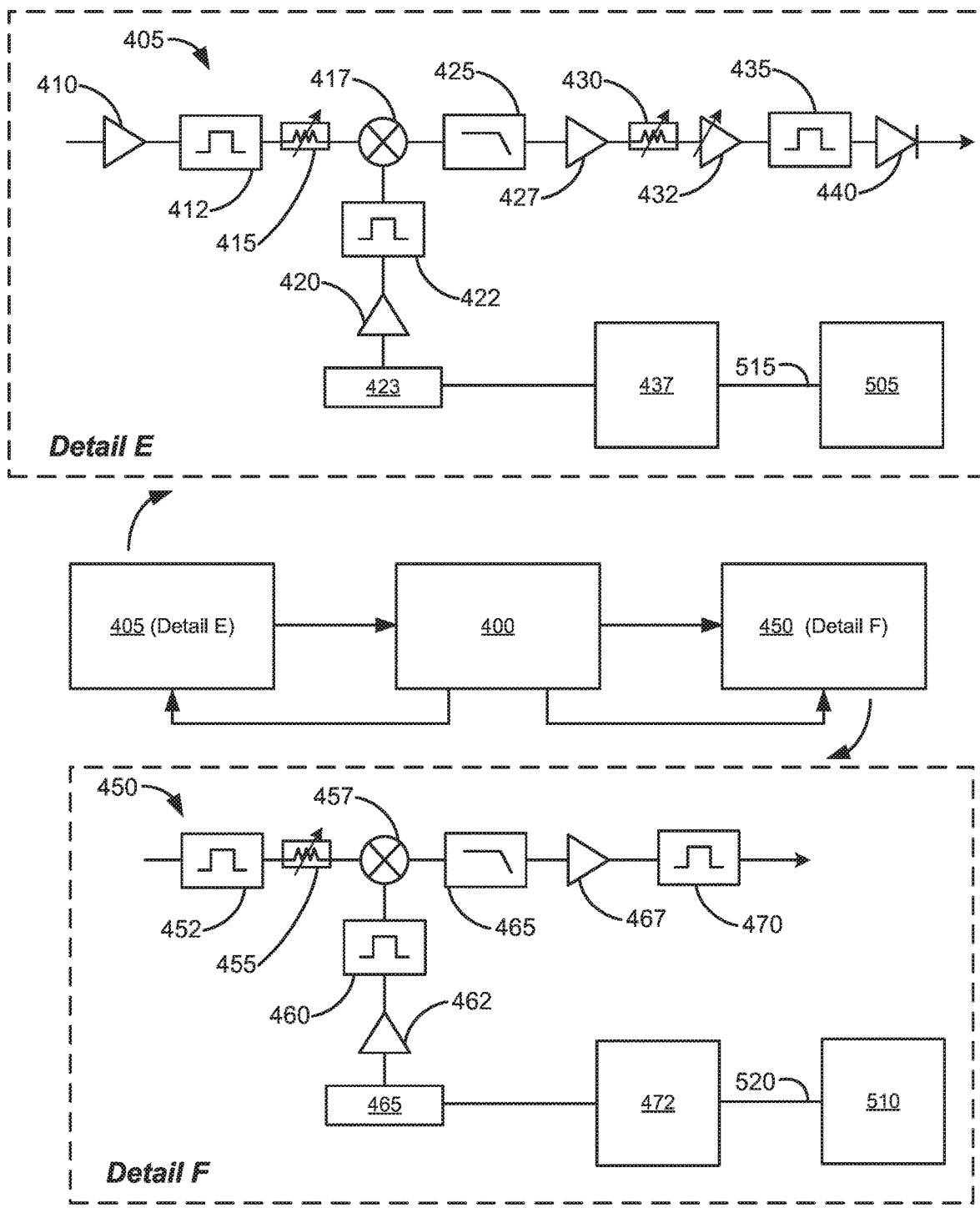
FIG. 4 is another example of a flexible RF converter block diagram.

The RF downconverter 405 may include a controller and/or a control interface 437 that may include a microcontroller, processor, and/or other circuitry for interfacing with DCP 400, a dedicated payload controller, or spacecraft bus control electronics. The control interface 437 may generate a signal that is provided to synthesizer 423 such that it can generate a synthesizer signal at an appropriate frequency. In some implementations, control interface 437 may be a microprocessor that communicates via a serial bus with a controller area network (CAN) bus interface, for example, that receives commands from a dedicated payload controller, DCP 400, or other circuitry or spacecraft bus control electronics. For example, in Detail E in FIG. 4, CAN bus interface 505 can communicate with control interface 437 (via serial CAN bus 515) which in turn might communicate with synthesizer 423 and provide a message (e.g., a 32-bit word) indicating the frequency of the synthesizer signal generated by synthesizer 423 or the frequency that the input signal at the output of mixer 417 should be at. As a result, a CAN bus communicates with control interface 437 (e.g., a microcontroller) to provide a command to synthesizer 423, for example, via a 32-bit word representing the command. In some implementations, PCB 205 can also include a DC-to-DC converter for powering the circuitry disclosed herein. As a result, a DC-to-DC converter can also be disposed on PCB 205 and housed within chassis 200 to provide a voltage source for the various components of an RF converter. In some implementations, the functionality of control interface 437 may be implemented within DCP 400.

The processed input signal at the new IF frequency can then be provided to DCP 400 for further processing. For example, DCP 400 might beamform the signal by adjusting its properties or characteristics, such as the phase and amplitude. The input signal can then be provided to flexible RF upconverter 450, which can be an up converter in FIG. 3.

Referring now to Detail D in FIG. 3, RF upconverter 450 includes anti-aliasing filter 452, attenuator 455, mixer 457, filter 460, amplifier 462, synthesizer 465, a control interface 472, harmonic filter 465, amplifier 467, and filter 470. Similar to RF downconverter 405, RF upconverter 450 can also frequency convert a signal received at its input using mixer 457. For example, RF upconverter 450 can implement an up converter with the control interface 472 communicating with synthesizer 465 to generate a synthesizer signal received by mixer 457. Mixer 457 also receives the signal provided by DCP 400, and therefore, provides the signal provided by DCP 400 at a new frequency based on the frequencies of the signals that it receives. In some implementations, the functionality of control interface 472 may be implemented within DCP 400. In some implementations, as in Detail F in FIG. 4, CAN bus interface 510 may also communicate via CAN bus 520 to control interface 472, similar to Detail E.

In some implementations, control interfaces 437 and 472 can adjust the synthesizer signal generated by the respective synthesizers to change the up conversion or down conversion of frequencies. For example, control interface 437 can analyze temperature data, determine that the IF frequency should change based on that temperature data, and send data via the CAN bus to synthesizer 423 such that the frequency of the synthesizer signal it generates is different. As a result, the frequency that the input signal is down converted to can change. In other implementations, the up conversion frequency can be changed. This can allow the spacecraft to maintain its usefulness as its operating environment changes. That is, the RF converters are "flexible" since the frequencies up or down converted can be adjusted by control interfaces 437 and 472. This is in contrast with a fixed synthesizer, for example, RF converter 100 in FIG. 1.

RF downconverter 405 and RF upconverter 450 can be implemented on different PCBs. As a result, each can be included in separate chassis 200. Multiple "slices" of RF converter can be stacked next to or upon each other due to the card-like shape of the chassis 200.

Thus, techniques have been disclosed wherein a flexible radio frequency converter can be implemented within a spacecraft. The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. An apparatus comprising:
 a spacecraft payload including a digital channelizer processor (DCP) and a flexible radio frequency (RF) converter, the flexible RF converter including:
 a printed circuit board (PCB);
 a local oscillator synthesizer disposed on the PCB, the local oscillator synthesizer configured to provide a synthesizer signal;
 a control interface disposed on the PCB, the control interface communicatively coupled with the DCP and the local oscillator synthesizer and configured to adjust, responsive to commands received from the DCP, a frequency of the synthesizer signal provided by the local oscillator synthesizer;
 a DC-DC converter; and a chassis; wherein
the chassis is configured to enclose the PCB, the local oscillator synthesizer, the control interface, and the DC-DC converter;
the flexible RF converter is configured to receive an input radio frequency (RF) signal within a first frequency band and provide, for beamforming by the DCP, an output RF signal at a second, different frequency band, the second frequency band being adjustable based on the frequency of the synthesizer signal, the beamforming including adjusting one or both of a phase and an amplitude of the output RF signal.

2. The apparatus of claim 1, wherein one or both of the local oscillator synthesizer and the control interface are packaged in one or more Quad Flat No-leads (QFN) packages.

3. The apparatus of claim 2, wherein the one or more QFN packages are hermetically sealed.

4. The apparatus of claim 3, wherein the one or more QFN packages are surface mounted on the PCB.

5. The apparatus of claim 3, wherein the chassis is not hermetically sealed.

6. The apparatus of claim 1, wherein the second frequency band is a lower frequency band than the first frequency band.

7. The apparatus of claim 1, wherein the second frequency band is a higher frequency band than the first frequency band.

8. The apparatus of claim 1, wherein the control interface is further configured to adjust the frequency of the local oscillator synthesizer signal such that the input RF signal is provided at a third frequency band, the third frequency band different than the second frequency band.

9. The apparatus of claim 1, wherein the control interface communicates with the synthesizer using a controller area network (CAN) bus interface.

10. The apparatus of claim 1, wherein the DC-DC converter disposed on the PCB is configured to provide a voltage source to the control interface and the synthesizer.

11. A spacecraft payload subsystem comprising:
a digital channelizer processor (DCP) and a flexible radio frequency (RF) converter, the flexible RF converter including:
a printed circuit board (PCB);
a local oscillator synthesizer disposed on the PCB, the synthesizer configured to provide a synthesizer signal;
a control interface disposed on the PCB, the control interface communicatively coupled with the DCP and the local oscillator synthesizer and configured to adjust, responsive to commands received from the DCP, a frequency of the synthesizer signal provided by the local oscillator synthesizer;
a DC-DC converter; and
a chassis; wherein:
the chassis is configured to enclose the PCB, the local oscillator synthesizer, the control interface, and the DC-DC converters;
the flexible RF converter is configured to receive an input radio frequency (RF) signal within a first frequency band and provide, for beamforming by the DCP, an output RF signal at a second, different frequency band, the second frequency band being adjustable based on the frequency of the synthesizer signal the beamforming including adjusting one or both of a phase and an amplitude of the output RF signal; and
the digital channelizer processor (DCP) circuit is configured to receive the output RF signal and adjust properties of the output RF signal, the DCP circuit being communicatively coupled with the control interface.

12. The spacecraft payload subsystem of claim 11, wherein one or both of the local oscillator synthesizer and the control interface are packaged in Quad Flat No-leads (QFN) packages.

13. The spacecraft payload subsystem of claim 12, wherein the QFN packages are hermetically sealed.

14. The spacecraft payload subsystem of claim 13, wherein the QFN packages are surface mounted on the PCB.

15. The spacecraft payload subsystem of claim 13, wherein the chassis is not hermetically sealed.

16. A spacecraft payload subsystem comprising:
a digital channelizer processor (DCP) circuit configured to provide an input radio frequency (RF) signal; and
a flexible radio frequency (RF) converter, the flexible RF converter including: a printed circuit board (PCB);
a local oscillator synthesizer disposed on the PCB, the local oscillator synthesizer configured to provide a synthesizer signal;
a control interface disposed on the PCB, the control interface communicatively coupled with the DCP circuit and the local oscillator synthesizer to adjust, responsive to commands received from the DCP, a frequency of the synthesizer signal provided by the local oscillator synthesizer;
a DC-DC converter; and
a chassis configured to enclose the PCB, the local oscillator synthesizer, the DC-DC converter and the control interface, wherein:
the flexible RF converter is configured to receive an input RF signal within a first frequency band and provide, for beamforming by the DCP circuit, an output RF signal at a second, different frequency band, the second frequency band being adjustable based on the frequency of the synthesizer signal, the beamforming including adjusting one or both of a phase and an amplitude of the output RF signal.

17. The spacecraft payload subsystem of claim 16, wherein one or both of the local oscillator synthesizer and the control interface are packaged in one or more Quad Flat No-leads (QFN) packages.

18. The spacecraft payload subsystem of claim 17, wherein the one or more QFN packages are hermetically sealed.

19. The spacecraft payload subsystem of claim 18, wherein the one or more QFN packages are surface mounted on the PCB.

20. The spacecraft payload subsystem of claim 18, wherein the chassis is not hermetically sealed.

* * * * *

UNITED STATES PATENT AND TRADEMARK OFFICE
CERTIFICATE OF CORRECTION

PATENT NO. : 10,577,130 B1  
APPLICATION NO. : 15/372276  
DATED : March 3, 2020  
INVENTOR(S) : Robert Mark Parish and Rick-Nghia Nguyen Page 1 of 1

It is certified that error appears in the above-identified patent and that said Letters Patent is hereby corrected as shown below:

In the Claims

Claim 11 (Column 7, Line 57) change "DC-DC converters" to -- DC-DC converter --.

Signed and Sealed this
Twenty-ninth Day of November, 2022

Katherine Kelly Vidal
*Director of the United States Patent and Trademark Office*